United States Patent
Alsaiary et al.

(10) Patent No.: US 10,556,791 B2
(45) Date of Patent: Feb. 11, 2020

(54) CMOS COMPATIBLE CAPACITIVE ABSOLUTE PRESSURE SENSORS

(71) Applicants: Tariq Salim Alsaiary, Jeddah (SA); Ibrahim Abdullah Alhomoudi, Alholaliah Town (SA)

(72) Inventors: Tariq Salim Alsaiary, Jeddah (SA); Ibrahim Abdullah Alhomoudi, Alholaliah Town (SA)

(73) Assignee: King Abdulaziz City for Science and Technology, Riyadh (SA)

( * ) Notice: Subject to any disclaimer, the term of this patent is extended or adjusted under 35 U.S.C. 154(b) by 0 days.

(21) Appl. No.: 15/653,898

(22) Filed: Jul. 19, 2017

(65) Prior Publication Data
US 2018/0022600 A1    Jan. 25, 2018

Related U.S. Application Data

(60) Provisional application No. 62/363,933, filed on Jul. 19, 2016.

(51) Int. Cl.
*H01L 29/10* (2006.01)
*H01L 31/036* (2006.01)
(Continued)

(52) U.S. Cl.
CPC ............ *B81C 1/00246* (2013.01); *B81B 7/02* (2013.01); *B81C 1/00269* (2013.01);
(Continued)

(58) Field of Classification Search
CPC ............ H01L 2924/1461; H01L 28/60; B81B 2201/0264; B81B 2203/0127; B81B 2207/015; B81B 7/008; B81B 2203/0315
See application file for complete search history.

(56) References Cited

U.S. PATENT DOCUMENTS 6,012,336 A * 1/2000 Eaton .................. B81C 1/00246
                                                              73/754
7,989,248 B2 * 8/2011 Kumar .................. B81C 1/0023
                                                              438/50
(Continued)

*Primary Examiner* — Bradley Smith
*Assistant Examiner* — David J Goodwin
(74) *Attorney, Agent, or Firm* — Rosenberg, Klein & Lee

(57) ABSTRACT

Monolithic integration of microelectromechanical systems (MEMS) sensors with complementary oxide semiconductor (CMOS) electronics for pressure sensors is a very challenging task. This is primarily due to the requirement for a very high quality thin diaphragm to provide the pressure dependent MEMS deformation that can be sensed and, when seeking absolute rather than relative pressure sensors, a sealed reference cavity. Accordingly, a new manufacturing process is established based upon back-etching and bonding of a monolithic absolute silicon carbide (SiC) capacitive pressure sensor. Beneficially, the process embeds the critical features of the MEMS within a shallow trench formed within the silicon substrate and then processing the CMOS circuit. The process further benefits as it maintains that those elements of the MEMS element fabrication process that are CMOS compatible are implemented concurrently with those CMOS steps as well as the metallization steps. However, the CMOS incompatible processing is partitioned discretely.

6 Claims, 11 Drawing Sheets

(51) Int. Cl.
  *G01L 9/00* (2006.01)
  *B81C 1/00* (2006.01)
  *B81B 7/02* (2006.01)
  *G01L 19/14* (2006.01)

(52) U.S. Cl.
  CPC .......... *G01L 9/0042* (2013.01); *G01L 9/0045* (2013.01); *G01L 9/0054* (2013.01); *G01L 9/0072* (2013.01); *G01L 19/147* (2013.01)

(56) References Cited

U.S. PATENT DOCUMENTS

| | | | |
|---|---|---|---|
| 8,617,960 B2 * | 12/2013 | Denison | H04R 19/04 |
| | | | 216/17 |
| 9,341,529 B2 * | 5/2016 | Nishikage | G01L 9/0045 |
| 2006/0081058 A1 * | 4/2006 | Silverbrook | B60C 23/0408 |
| | | | 73/729.2 |
| 2007/0284682 A1 * | 12/2007 | Laming | B81C 1/00158 |
| | | | 257/416 |
| 2011/0075865 A1 * | 3/2011 | Yang | H04R 19/005 |
| | | | 381/174 |
| 2012/0211805 A1 * | 8/2012 | Winkler | B81C 1/00246 |
| | | | 257/254 |
| 2013/0137958 A1 * | 5/2013 | Tai | A61B 3/16 |
| | | | 600/398 |
| 2014/0338459 A1 * | 11/2014 | Besling | G01L 9/0073 |
| | | | 73/718 |
| 2017/0247248 A1 * | 8/2017 | Hoekstra | B81B 7/008 |

* cited by examiner

CMOS COMPATIBLE CAPACITIVE ABSOLUTE PRESSURE SENSORS

CROSS-REFERENCE TO RELATED APPLICATIONS

This patent application claims the benefit of U.S. Provisional Patent Application 62/363,933 filed on Jul. 19, 2016 entitled "CMOS Compatible Capacitive Absolute Pressure Sensors."

FIELD OF THE INVENTION

This invention relates to microelectromechanical systems (MEMS) and more particularly to CMOS compatible MEMS devices and absolute pressure sensors.

BACKGROUND OF THE INVENTION

Pressure sensors have been the interest from the earliest development of microelectromechanical systems (MEMS). However, at that point, the majority of MEMS sensors were assembled by combining separately manufactured mechanical, e.g. silicon (Si) MEMS, and electrical components, e.g. complementary oxide semiconductor (CMOS) integrated circuits (IC) for low power operation, formed upon two different substrates. These discrete MEMS and CMOS components were then used to realize the final pressure sensor by mounting them to a common carrier, electrically connecting the MEMS and CMOS parts together through wire-bonding or other assembling technologies, and then packaging them. This approach to integration imposes limitations on performance, e.g. due to the higher parasitics involved, on size, cost, etc.

Accordingly, there has been interest within the industry for tighter integration of the MEMS and IC parts, as this should mitigate many of the limitations identified above and is a logical solution to enhance the functionality of systems. This has led to a variety of techniques being developed and employed within the prior art for CMOS-MEMS integration through both hybrid and monolithic integration, the latter being where both technologies are implemented on a single common substrate during manufacturing. The most common monolithic integration being the formation of the MEMS device(s), after the manufacture of the CMOS circuit, within dedicated areas without electronics. However, such monolithically integrated CMOS-MEMS systems adds complexity to the overall fabrication process sequence due to a variety of factors including, for example, added constraints on the thermal budgets and the materials stresses involved.

As a result, the monolithic integration of MEMS sensors with CMOS overall has proven to be a challenging task, and with respect to MEMS pressure sensors with CMOS IC's then these have proven to be a very challenging task. This is primarily due to the need for such devices to include a very high quality thin diaphragm to provide the pressure dependent MEMS deformation that can be sensed and, when seeking absolute rather than relative pressure sensors, a sealed reference cavity. Typically, this is achieved within the prior art through a bonding process that employs multiple wafers, or by exploiting high temperature deposition techniques capable of creating the required movable/deformable diaphragm. However, such high temperature deposition techniques are not compatible with standard CMOS processes, i.e. the temperatures involved are typically higher than 400° C., thereby requiring that the CMOS be fabricated after the formation of the MEMS, which is extremely challenging or that the CMOS electronics are degraded.

Accordingly, the inventors have established a new manufacturing process based upon back-etching and bonding of a monolithic absolute silicon carbide (SiC) capacitive pressure sensor. Beneficially, the process achieves integration through the embedding of the critical features of the MEMS within a shallow trench formed within the silicon substrate and then processing the CMOS circuit. Accordingly, the process beneficially maintains that the components of the MEMS element fabrication process that are CMOS compatible are implemented concurrently with those CMOS steps as well as the metallization steps. However, the CMOS incompatible processing is partitioned discretely.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to microelectromechanical systems (MEMS), and more particularly to CMOS compatible MEMS devices and absolute pressure sensors.

In accordance with an embodiment of the invention there is provided a method comprising:
manufacturing a first portion of a microelectromechanical systems (MEMS) element for monolithic integration with a complementary oxide semiconductor (CMOS) integrated circuit (IC) using a high temperature MEMS processing process;
manufacturing the CMOS integrated circuit; and
manufacturing a second portion of the MEMS element at least one of during and subsequent to the CMOS integrated circuit; wherein
the second portion of the MEMS element is formed with a low temperature MEMS processing.

In accordance with an embodiment of the invention there is provided a device comprising:
a first portion of a microelectromechanical systems (MEMS) element within a trench formed within a substrate comprising a complementary oxide semiconductor (CMOS) integrated circuit (IC);
the CMOS integrated circuit; and
a second portion of the MEMS element formed upon a predetermined region of the substrate and overlapping a predetermined portion of the first portion of a microelectromechanical systems (MEMS) element within the trench.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 2:
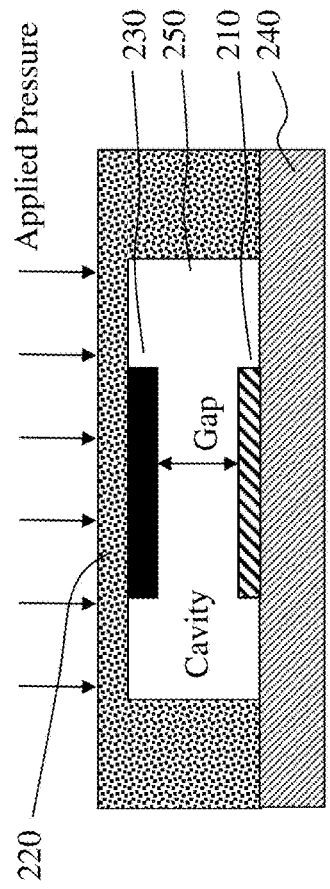
FIG. 2 depicts schematically the basic structure of an absolute capacitive pressure sensor.

The present invention is directed to microelectromechanical systems (MEMS), and more particularly to CMOS compatible MEMS devices and absolute pressure sensors.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users. Reference to terms "including", "comprising", "consisting" and grammatical variants thereof do not preclude the addition of one or more components, features, steps, integers or groups thereof and that the terms are not to be construed as specifying components, features, steps or integers. Likewise, the phrase "consisting essentially of", and grammatical variants thereof, when used herein is not to be construed as excluding additional components, steps, features integers or groups thereof but rather that the additional features, integers, steps, components or groups thereof do not materially alter the basic and novel characteristics of the claimed composition, device or method. If the specification or claims refer to "an additional" element, that does not preclude there being more than one of the additional element.

A: Principle of Novel Absolute Capacitive Pressure MEMS-CMOS Sensor

A.1 Principle of Operation of an Absolute Pressure Sensor

Figure 1:
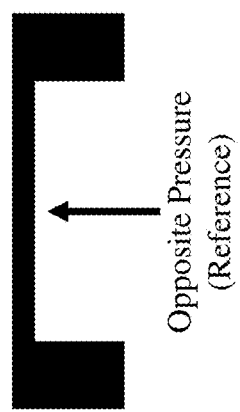
FIG. 1 depicts a demonstration of the three elements required for pressure measurement.

In general, the definition of pressure is the amount of a normal force of an object acting on the surface of another object. For example, in atmospheric pressure, the normal force is created by the vertical column of air above any given surface. It should be noted that the definition implies that, for any given pressure on one side of a surface, there is an opposite pressure on the other side. This is obvious from the Newton's third law which states that for every action, there is an equal and opposite reaction. Therefore, there is no meaning for a pressure value, if the opposite pressure is not defined. FIG. 1 shows the relation between these three elements: the given pressure, the surface, and the opposite pressure.

Within an absolute pressure sensor, the reference pressure is ideally set to zero Pascal (0 Pa), which is a vacuum level. Thus the ambient atmospheric pressure is included in the measurement. This approach is widely used in altimeters for altitude measurement.

A.2 Pressure Sensing Schemes

A sensing scheme is the method used to sense the pressure such that the pressure is translated into a physical quantity that can be detected and measured. Amongst the physical quantities that we can measure are capacitances, resistances, frequency, charges, etc. According to the pressure full scale, which is the difference between the maximum and minimum detectable pressure levels, these schemes can be divided into: wide and narrow range pressure transducers. Capacitive, piezo-resistive, and piezoelectric are the most popular sensing schemes for wide-range pressure sensors. Narrow range pressure sensors are generally known as vacuum level transducers, such as Pirani gauges and resonators.

Within the embodiments of the invention described below in respect of FIGS. 4 to 11D the inventors present absolute pressure MEMS sensors exploiting a capacitive sensing scheme employing a deflected diaphragm for detection. It actually consists of two plates where one is deflected due to the applied pressure, while the other one is fixed. The sensor is basically a variable capacitor whose value is a function of the gap between two plates. This technology is known to have high resolution and sensitivity, low power consumption, and lower temperature dependency. Also, it usually features stable performance. However, it would be evident to one of skill in the art that the underlying manufacturing principles according to these embodiments of the invention presented may be exploited with other sensing schemes and/or other MEMS devices.

A.3 Capacitive Absolute Pressure Sensor

Within embodiments of the invention, capacitance sensing for pressure exploits the result that the effect of the applied pressure deforming a membrane to produce a measurable quantity, namely a capacitance/capacitance variation as the deforming membrane is one plate of a parallel plate capacitor. As a result, over a reasonable range, every pressure level corresponds to a capacitance value. Referring to FIG. 2 there is depicted one possible structure for an absolute capacitive pressure sensor formed upon a substrate 240 which consists of a fixed electrode 210, the diaphragm 220, the movable electrode 230 and a cavity 250. Sometimes, the diaphragm is referred to as a movable electrode, and it usually consists of structural and electrode layers. By exploiting a multiple layer membrane, the designer is given more flexibility to establish the characteristics of the diaphragm mechanically and electrically required for the desired pressure sensor with respect to pressure range, resolution etc. The diaphragm seals the vacuum inside the cavity so that the applied pressure is measured with respect to zero millibar (0 mbar). To achieve a high sealing level and a deformable membrane the design requires a thin defect-free diaphragm be manufactured.

Figure 3:
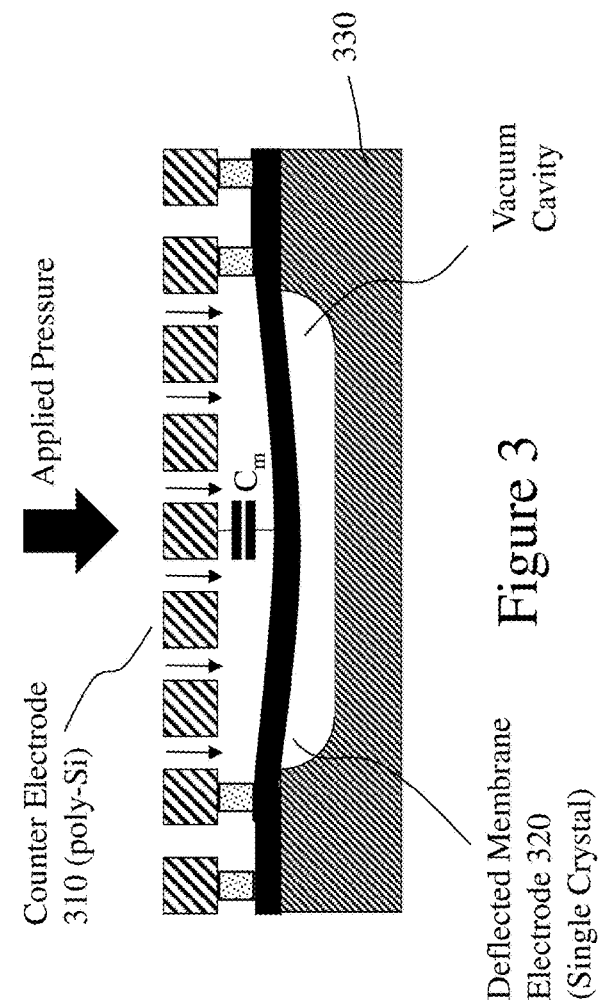
FIG. 3 depicts schematically an alternate structure for an absolute capacitive pressure sensor.

For the structure depicted in FIG. 2, when the pressure increases, the gap between the two plates decreases which results in a higher capacitance as stated in Equation (1), where C is the capacitance, $\varepsilon_r$ is the relative permittivity of the medium between the plate, $\varepsilon_0$ is the permittivity of free space, A is the overlap area of the two plates, and g is the gap between the two plates. Changing the location of the cavity gives a different relation between the pressure and capacitance as evident from the prior art of Knese et al. in "Novel Technology for Capacitive Pressure Sensors with Monocrystalline Silicon Membranes" (Proc. IEEE $22^{nd}$ Int. Conf. Micro Electro Mechanical Systems, pp. 697-700, 2009). Within this work as depicted in FIG. 3 there are two gaps: an air gap between the fixed electrode, the counter electrode 310, and the movable electrode, the deflected membrane electrode 320 and its electrode, and a vacuum gap between the deflected membrane 320 and the substrate 330. A reduction in one gap leads to an increment in the other gap. Hence, when the input pressure pushes the membrane down, it increases the air gap, which in turn lowers the capacitance. On the other hand, if the input is less than the cavity pressure, the membrane deflects towards the counter electrode and the capacitance increases.

$$C = \frac{\varepsilon_r \varepsilon_0 A}{g} \quad (1)$$

The design involves optimizing the membrane dimensions to adjust the deflection range, which plays a crucial role in the sensitivity and linearity of the MEMS pressure sensor. There is no well-formulated equation that can describe the deflection response for all membrane shapes. The response of a circular shape as studied within the prior art is governed by Equation (2), where P is the pressure difference across the diaphragm, R is the radius of the diaphragm, E is the Young's modulus of the diaphragm, T is the diaphragm thickness, v is Poisson's ratio and $Y_0$ is the diaphragm's center displacement. Both E and v represent diaphragm material parameters whilst the other inputs are related to the diaphragm shape and dimensions. Most published prior art assumes a limited deflection range, in which the center displacement is strictly less than (⅓)×T. This limit guarantees a reliable performance, and simplifies Equation (2) as the second term becomes relatively small. Thus, omitting the second term and rearranging Equation (2) leads to the final response of a circle-shaped membrane given by Equation (3).

$$\frac{P \cdot R^4}{E \cdot T^4} = \frac{16}{3(1-v^2)} \frac{Y_0}{T} + \frac{7-v}{3(1-v)} \frac{Y_0^3}{T^3} \quad (2)$$

$$Y_0 = \frac{3(1-v^2)}{16} \frac{P \cdot R^4}{E \cdot T^4} \quad (3)$$

Further, the film residual stress must be well analyzed in order to enhance the reliability of the sensor. As diaphragms suffer from either a tensile or compressive stresses, the sensor may stop working properly if, for example, the diaphragm cracks and the reference cavity becomes filled with a medium of the same pressure as that being sensed, e.g. a liquid or gas. In order to avoid this problem, it is desirable to exploit a strong material with good flexibility. Also, changing the deposition parameters of the diaphragm material such as pressure and temperature can also be beneficial, as typically these have been identified within the prior art as having a significant impact on the film stress profile. It is important to keep in mind that high temperature processing may positively or negatively alter the residual stress of a film even after the deposition step. Thus, the thermal budget of the subsequent processing steps has to be considered carefully.

B: Approaches of CMOS-MEMS Monolithic System

There are three approaches to monolithic integration of CMOS and MEMS, namely CMOS-first, MEMS-first, and interleaving. Sometimes, wafer bonding is considered as a fourth approach even if the CMOS and MEMS are made separately on two different substrates, since the bonding results in a one bigger substrate. For the first two approaches, it is clear that the difference is based on the design sequence of the entire system. It either starts by fully implementing the electronic side and then processing the MEMS, or vice versa. However, the interleaving option allows one to start with either CMOS or MEMS, and then swap over before changing back. Potentially, this interleaving can be at any step, which imposes material limitations on the mechanical structure or electronics, and may in some instances involve swapping back-and-forth several times. However, interleaving typically requires a manufacturing facility that has the tools and equipment for the two technologies whereas with CMOS first or MEMS first the wafer may be part-fabricated in one facility or semiconductor processing line before being completed within another facility or different semiconductor processing line.

B.1 CMOS-First

This is also commonly known as the above-IC integration method as the MEMS is formed after and above the CMOS. It is an approach of interest because it is often impossible to modify an already existing CMOS process to accommodate MEMS fabrication steps. On the other hand, the implementation of the MEMS structures is now less flexible in materials, processing steps etc., as they have to meet many constraints, including the CMOS wafer thermal budget.

Figure 4:
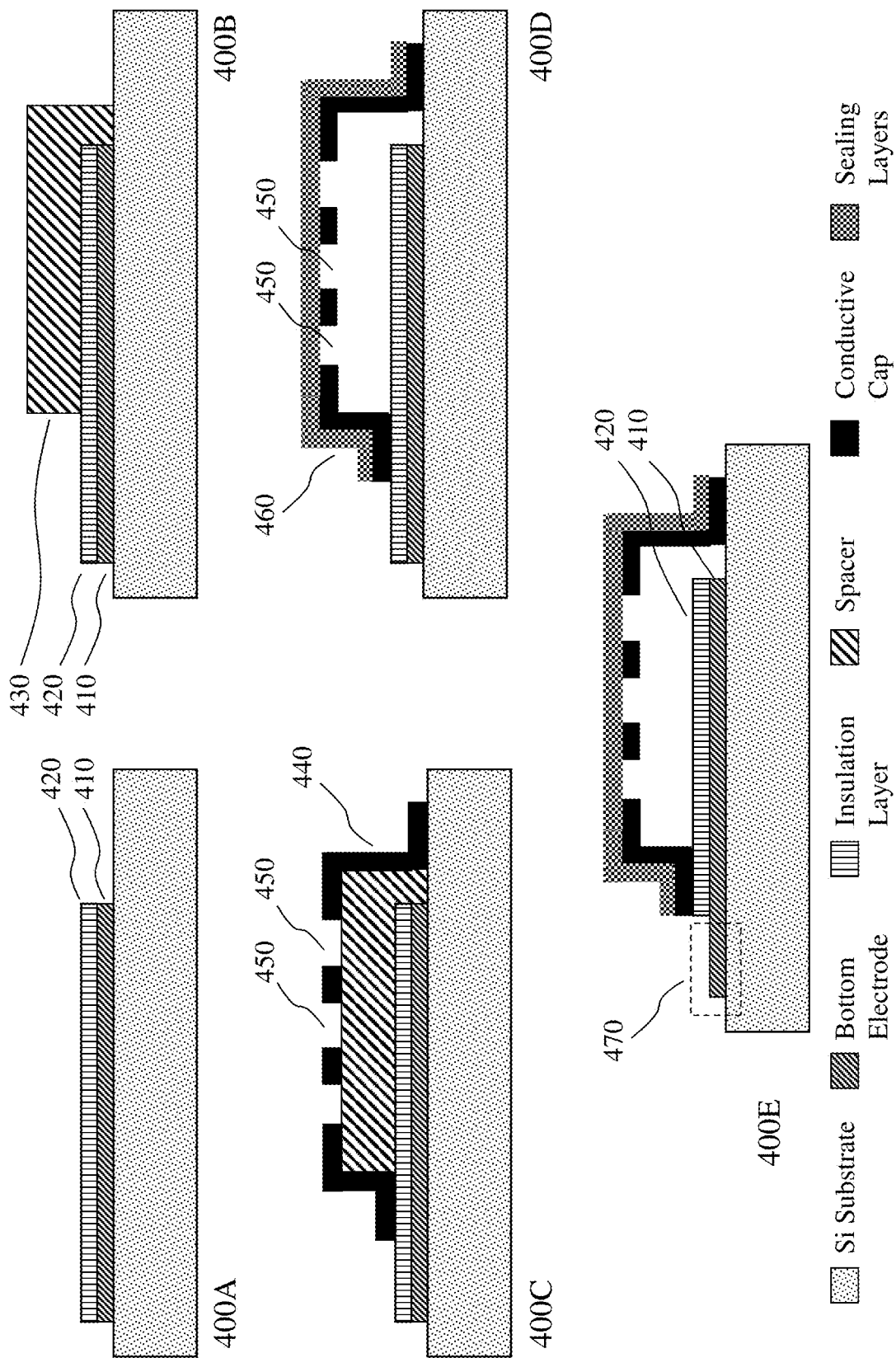
FIG. 4 depicts a generic process flow of a surface micromachined capacitive pressure sensor exploiting a MEMS device.

FIG. 4 shows the MEMS steps of a generic process flow for a CMOS-first pressure sensor. The design is based on the MEMS surface micro-machined method, which means that the MEMS parts are totally fabricated on top of the electronic circuit by depositing and etching films. It begins by forming a bottom electrode 410, and covering it by an insulation film 420, e.g. silicon dioxide ($SiO_2$) (first image 400A in FIG. 4). Next, a sacrificial layer 430 is used to define the cavity gap of the capacitive pressure sensor (second image 400B in FIG. 4). The removal of the sacrificial material must be easy and fast, and its etchant has to be highly selective in comparison with other films. Materials such as $SiO_2$, phosphosilicate (PSG) glass, and polymers are the typical options for this step. Subsequently, a conductive cap film 440 is deposited to form the top electrode, and is patterned to create release holes 450 (third image 400C in FIG. 4). In other instances, the top electrode is composed of a poor conductive support film and a conductive material such as aluminum to boost the electrical and mechanical response. Next, a release step is carried out, then the holes 450 are sealed by a single sealing layer 460 or multiple sealing layers (fourth image 400D in FIG. 4). Finally, the contact pad 470 of the bottom electrode 410 is exposed by etching the insulation film 420 (fifth image 400E in FIG. 4). Accordingly, it is evident from FIG. 4 that the diaphragm in this integration method is not a single layer. For example, it could be made of a conductive film, a cap, and several sealing layers.

B.2 MEMS-First Approach

This approach is the opposite of the above-IC method in Section B.1. Accordingly, this begins with depositing, patterning, and forming the movable parts, which changes the topography of the substrate's surface and accordingly can impact the subsequent CMOS IC processing. The main issue with the non-flat surface arises in the mask alignment steps because all CMOS process flows, especially those of doping and well constructions, require a direct contact photolithography process with the substrate surface for a better spatial resolution in order to avoid the expense of a projection stepper or electron beam lithography processing.

Figure 5:
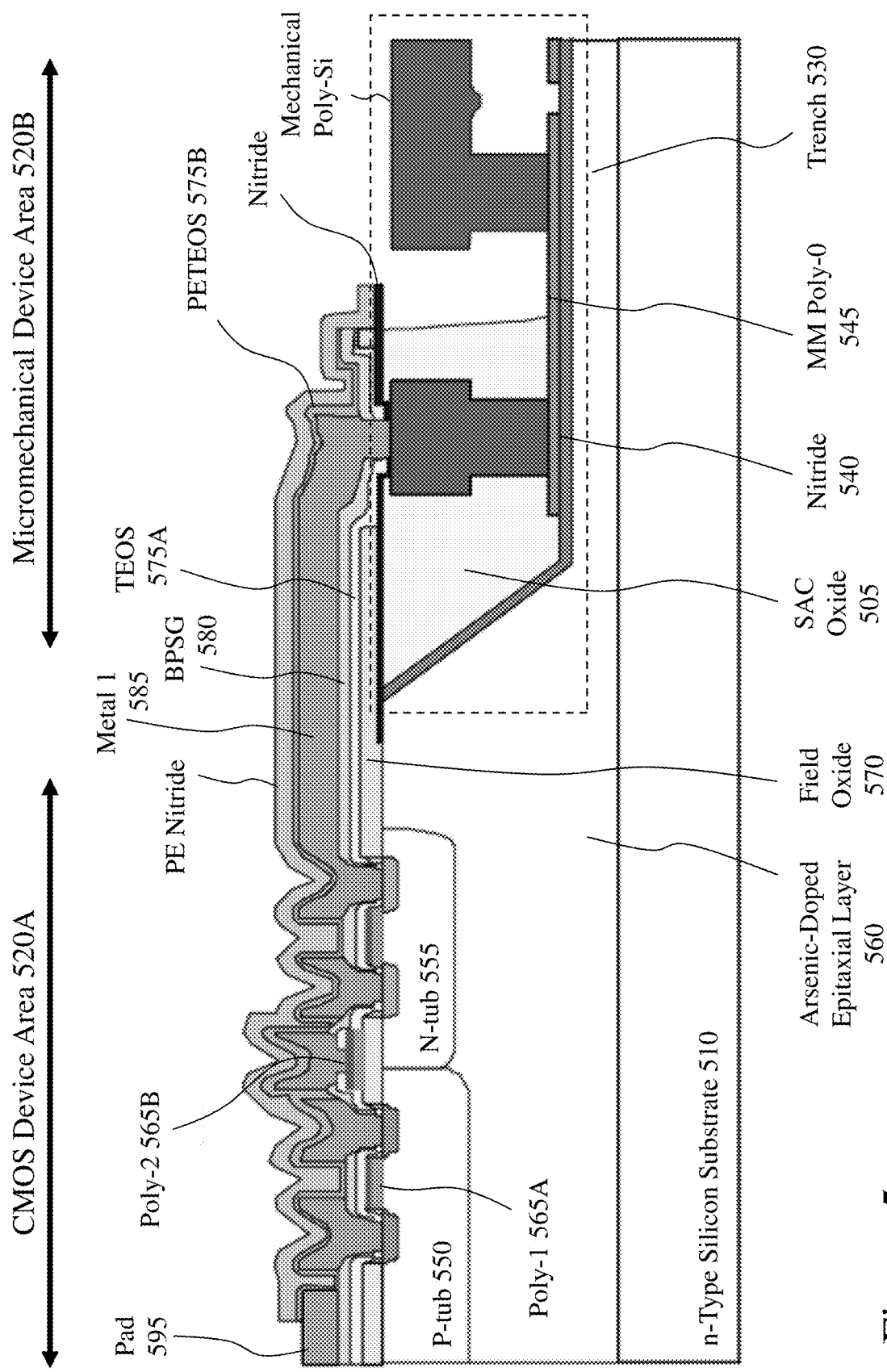
FIG. 5 depicts a schematic cross-section of a monolithic CMOS-MEMS device with formation of the MEMS structural element within a recess formed within the surface of the silicon substrate.

Accordingly, in order to overcome these limitations, the MEMS device within the micromechanical device area 520B is embedded into a shallow trench 530 formed within the silicon substrate 510 adjacent to the CMOS device area 520A. The design, depicted in cross-section in FIG. 5, begins by etching a few micrometers of the silicon substrate 510. The trench gap depends on how many spacer and structural films are required, as the summation of these thicknesses has to be equal to, or slightly less than, the depth of the trench, so that the surface is sufficiently flat for the subsequent IC process steps. For example, considering a MEMS gyroscope the trench depth may be ~9 μm whilst for a single axis accelerometer the trench depth may be ~6 μm. As depicted in FIG. 5 the MEMS device is formed from a stack formed upon a nitride layer 540 comprising MM Poly-0 545 and mechanical polycrystalline silicon (Poly-Si) 545. The CMOS device area 520A employs P-tub 550 and N-tub 555 doped regions within an arsenic doped epitaxial layer 560 within which the trench 530 is also formed. Disposed atop the doped regions forming electrical interconnections within the CMOS device area 520A and to the micromechanical device area 520B is a stack comprising first polyimide layer (Poly-1) 565A, silicon dioxide (field oxide) 570, tetraethyl orthosilicate (TEOS) 575A, borophosphosilicate glass (BPSG) 580, metallization (Metal-1) 585, plasma enhanced TEOS (PETEOS) 575B, and plasma enhanced silicon nitride (PE Nitride) 590. Additionally, within the CMOS device area 520A a second polyimide layer (Poly-2) is employed whilst external electrical connections from the CMOS device area 520A to other circuits, packaging, etc. are made via Pads 595. Support for the electrical connection between the CMOS device area 520A and the micromechanical device area 520B.

Figure 6:
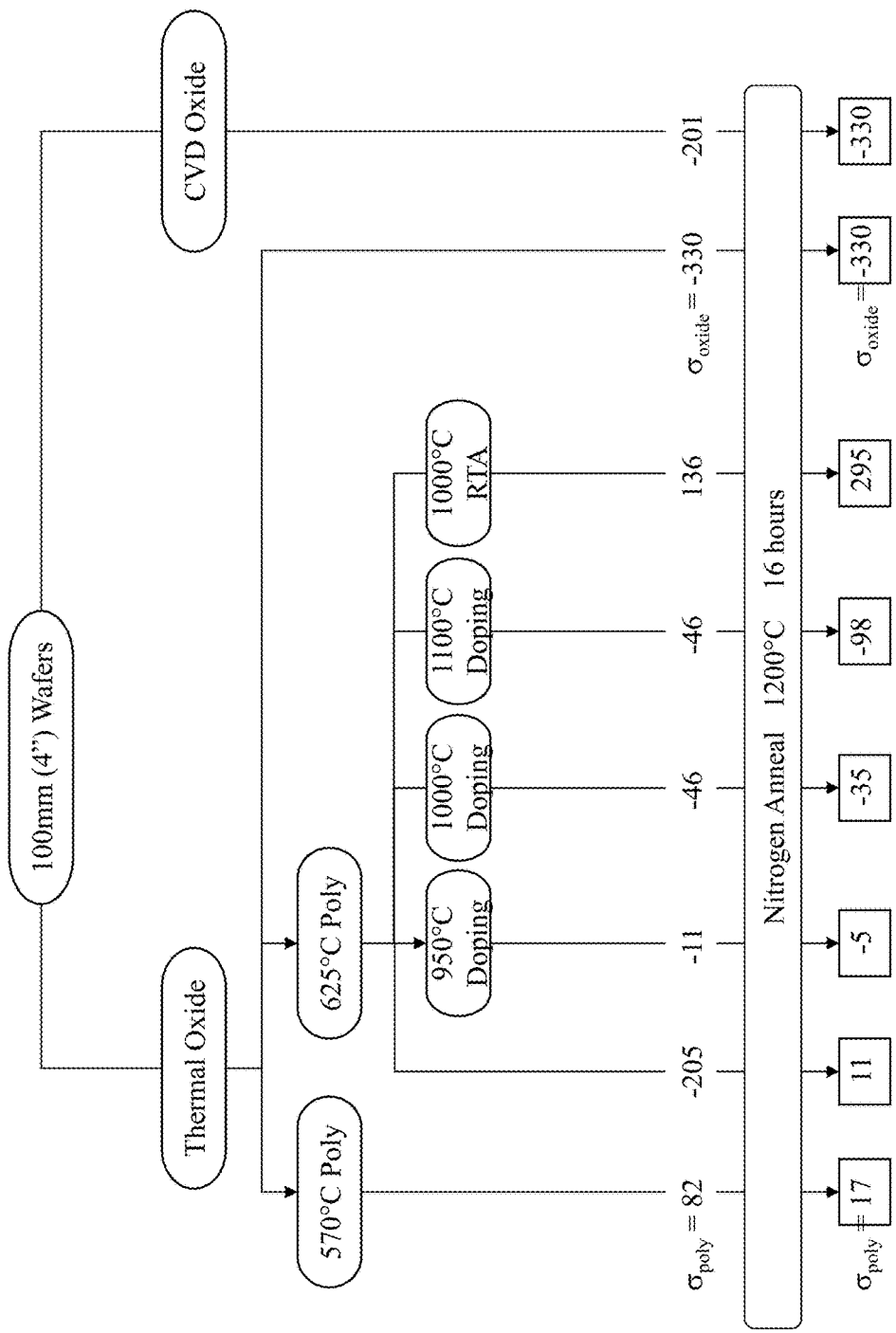
FIG. 6 depicts the impact of a long annealing step on polysilicon and $SiO_2$ films deposited by different processes.

After defining the trench, few processing factors have to be considered/addressed. First, an insulation film must be deposited prior to the MEMS fabrication process. Second, all spacers must be released after the completion of the CMOS processing steps in order to keep the residual stress low. Third, the trench has to be filled with dielectric, e.g. $SiO_2$, once the MEMS processing steps are completed, such that a chemical mechanical polishing (CMP) step can be sequentially executed to planarize ("flatten") the $SiO_2$. Further, a layer of low stress, e.g. silicon nitride ($Si_3N_4$) may be required to protect the $SiO_2$ filling. Fourth, the wafer has to be annealed to reduce the as-deposited stress of the whole structure. Fifth, the MEMS materials must be chosen to withstand the higher annealing temperatures within the CMOS semiconductor processing technology. Also, its effect on the residual stress of the MEMS materials should be either small or reproducible to allow an initial compensating offset to be established. A combination of $SiO_2$ and polysilicon is typically employed within a MEMS-first approach, as annealing could lower the polysilicon residual stress. Referring to FIG. 6 there is depicted the impact of annealing on the residual stress of polysilicon and $SiO_2$ for different deposition techniques. Finally, the CMOS is implemented adjacent to the MEMS devices, and the protective $Si_3N_4$, spacers, and the $SiO_2$ filling are etched. The metallization is realized, for example, by the deposition of an Al film.

B.3 CMOS-First vs MEMS-First

Both of the approaches described above, namely, CMOS-first and MEMS-first, limit the material choices for the MEMS designs. The CMOS-first imposes a low thermal budget, which means that the MEMS part has to be manufactured with low temperature processes, i.e. <400° C. On the contrary, high temperature processes are allowed in the MEMS-first approach, but there still are material limitations, due to the effect of the following CMOS annealing steps on the MEMS structures.

Accordingly, starting with the MEMS devices is better if the sensor needs a good quality film, because high temperature depositions (i.e. LPCVD) are capable of creating polycrystalline films. They have less porosity, which makes them an attractive choice for a pressure sensor to capture a vacuum inside a cavity. On the other hand, the CMOS-first strategy requires less steps, because there is no need for a trench as the MEMS processing does not have the same lithography requirements. Further, the MEMS may be manufactured directly on top of the electronic circuits, which lowers the electronic interconnect parasitics introduced to a minimum and the die footprint is defined by the larger of the CMOS and MEMS rather than their sum.

C: Novel CMOS-MEMS Manufacturing Methodology

Figure 7:
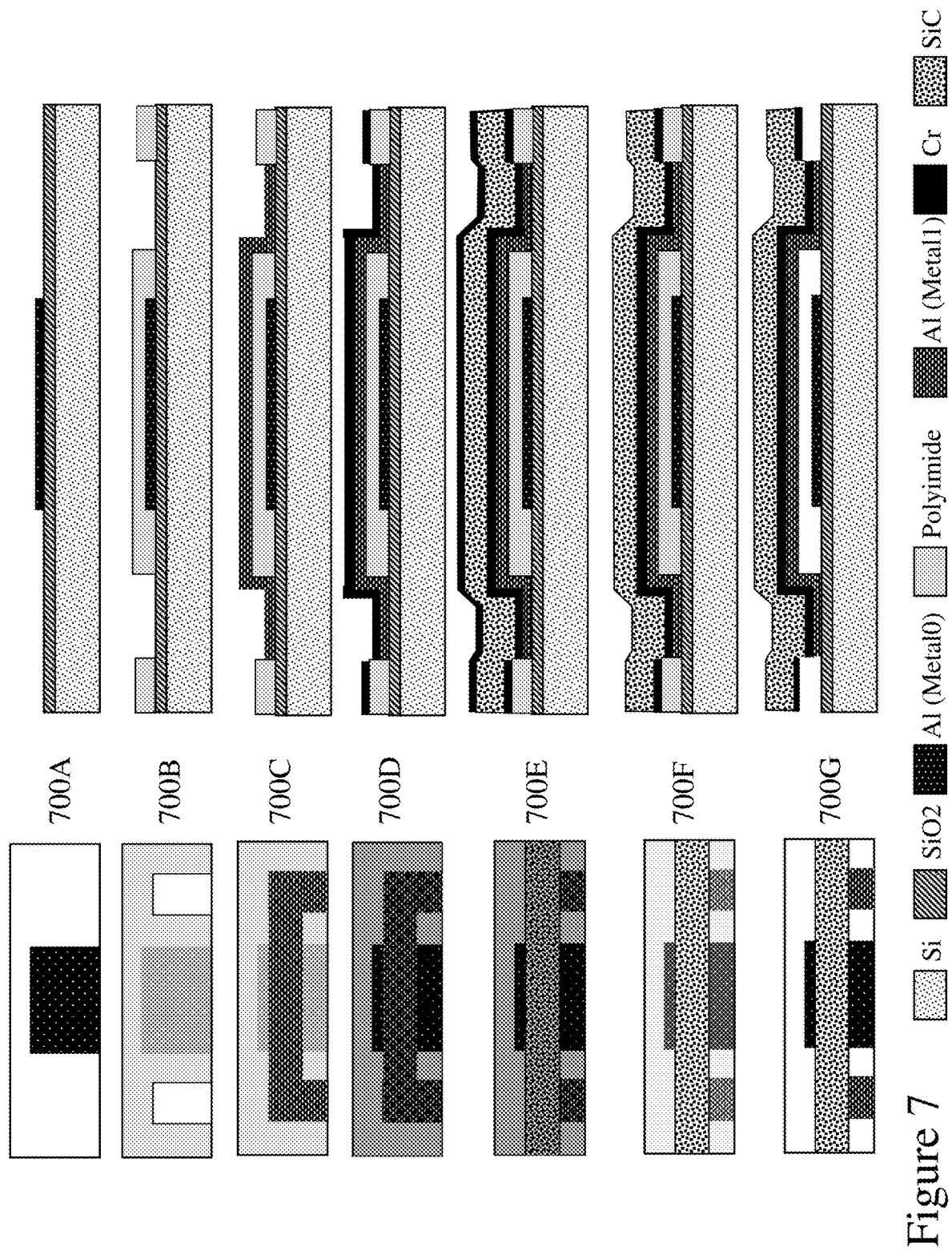
FIG. 7 depicts an exemplary process flow for a clamped-clamp beam resonator exploiting low temperature deposited, low stress silicon carbide (SiC)

The inventive design and manufacturing methodology established by the inventor's leverages work within the prior art by Nabki et al. in "Low-stress CMOS-Compatible Silicon Carbide Surface-Micromachining Technology—Part 1: Process Development and Characterization" (J. Microelectromechanical Systems, Vol. 20(3), pp. 720-729) and Zhang et al. in "Thin-Film Encapsulation Technology for Above-IC MEMS Wafer-Level Packaging" (J. Micromechanics and Microengineering, Vol. 23(12), #125012). Nabki was able to define a process to deposit silicon carbide (SiC) at low temperature via a dc-sputtering method and demonstrated a clamped-clamped beam resonator. An exemplary manufacturing process using low temperature SiC using the process flow is depicted in FIG. 7. This process started by covering the silicon substrate, which was thermally oxidized, with a ground electrode made of a 60 nm dc-sputtered Al. After that, the Al layer was patterned with a photoresist, and etched via a PAN solution as depicted in first image 700A in plan (left) and cross-section (right) respectively. Next, as depicted in second image 700B, a spin-coated polyimide sacrificial layer was deposited, followed by a curing step in the oven at 300° C. After patterning and etching the polyimide film, a sputtered Al was deposited to form a lower electrode, see third image 700C, and then (chromium (Cr)/SiC/Cr) were dc-sputtered in sequence with thicknesses Cr-80 nm/SiC-2 μm/Cr-0.5 μm. The thicker upper Cr layer was employed for patterning the SiC mechanical layer, while the thinner lower Cr layer was employed to protect the underlying layers, i.e. lower electrode, polyimide, etc. Fourth image 700D depicts the device after deposition of the lower Cr layer whilst fifth image 700E depicts the structure after deposition of the SiC mechanical layer and upper Cr layer. After defining the SiC structure using RIE etching, both Cr layers were wet etched by a mixture of ceric ammonium nitrate and acetic acid resulting in the structure depicted in sixth image 700F. Finally, a release step was performed using an oxygen plasma to etch the polyimide as depicted in seventh image 700G.

The mechanical features of the SiC layers realized are very appealing for designers seeking to lower the fabrication thermal budget, while keeping good mechanical properties. In terms of elasticity, the Young's modulus is 260 GPa, which is slightly lower than other reported SiC layers established through high temperature processing techniques. Further, it was shown by Nabki that the residual stress could be controlled by adjusting the gas pressure inside the deposition chamber during the deposition of the SiC. For a clamped-clamped beam resonator Nabki demonstrated that the stress was within the range ±50 MPa at 6 mtorr gas pressure, which is excellent for building reliable systems.

In contrast, Zhang presents a capacitive pressure sensor whose diaphragm is similarly made of SiC. This design is compatible with a CMOS-first approach. However, in neither prior art is the ability to manufacture a capacitive absolute pressure sensor presented. Within the prior art of Zhang, the ability for the SiC cap to seal the vacuum required was evaluated and the results were not promising enough to proceed with building the pressure sensor. The experimental tests by Zhang employed a Pirani gauge to continuously monitor the cavity vacuum level. The principle of this type of pressure gauge is straightforward in that it is actually a resistance measurement, where the resistivity of the film changes due to the dynamic heat transfer between the resistive film and the surrounding fluid. In other words, the lower the pressure, the less fluid (typically gas) molecules, the less the conducive heat loss and hence the higher the resistivity.

Figure 8:
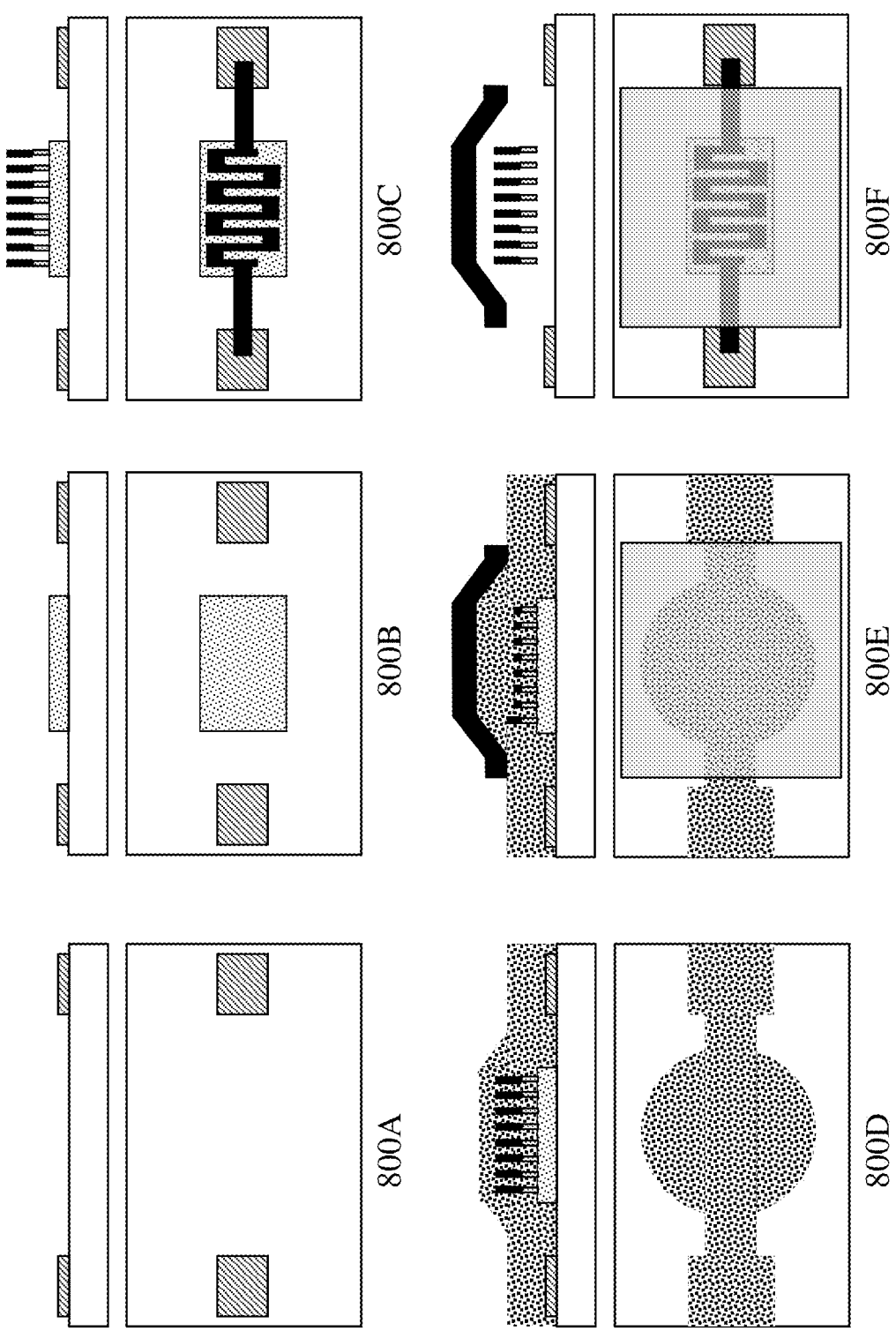
FIG. 8 depicts an exemplary process flow for the manufacture of an unsealed Pirani gauge beneath a SiC structural element.

An exemplary process flow according to the prior art of Zhang is depicted in FIG. 8. It begins with the sputtering and patterning of 300 nm Al pads on the surface of the silicon substrate, which is covered by $SiO_2$ as depicted in first image 800A. Next, a 400 nm spin-coated polyimide defined a sacrificial layer employed to suspend the Pirani gauge in the sensor cavity as depicted in second image 800B. A curing step was performed for 2 hours at 200° C., followed by dry etching with oxygen. Then a sequence of 80 nm Cr, 60 nm Al, and 2.2 μm SiC were deposited and covered by a 300 nm Cr on top. This is similar to the methodology of Nabki which used the top Cr as an etch mask, while the lower Cr acted as an etch stop layer. After shaping the SiC by $NF_3$ reactive ion etching (RIE), the underlying Al and Cr were removed using wet etchants. The resulting structure being depicted in third image 800C. The Al is for characterizing the Pirani's resistivity. After this processing, the polyimide was etched via oxygen plasma for 3 hours. After that, the definition of the cavity gap was achieved by spin-coating a 3 μm poly (propylene carbonate) (PPC) layer. The structure at this point being depicted in fourth image 700D. PPC is a polymer material that sublimes when heated to 300° C. It is a convenient sacrificial material for a low temperature process because the structure is quickly released, and there are no issues with respect to etchant selectivity. However, the PPC requires additional processing in order to be patterned, as it requires a hard masking method as conventional photoresist developer can attack the PPC layer during the photolithography step. To implement this, Zhang covered the PPC with titanium (Ti) and employed buffered oxide etch (BOE) and oxygen plasma RIE to pattern the Ti and PPC, respectively. Next, the Ti layer was removed, and a second 2.2 μm SiC layer was sputtered and patterned, as explained above in respect of the Nabki processing sequence, to form a cap layer with vent ports. This being depicted in fifth image 800E. The wafer was then heated up to 300° C. so that the PPC layer decomposed and transformed to gas and was released through the vent ports, resulting in the structure depicted in sixth image 800F. Finally, a 5 μm sealing layer Parylene C was deposited via chemical vapor deposition (CVD) (not depicted for clarity).

Figure 9:
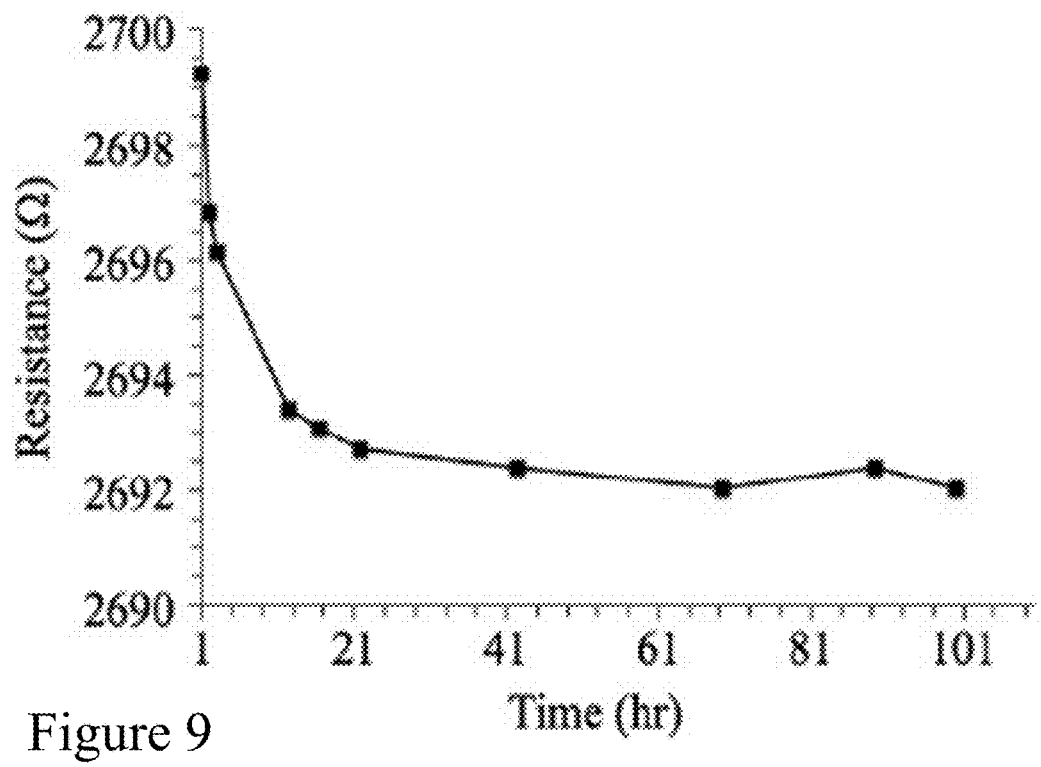
FIG. 9 depicts the resistivity of an unsealed Pirani gauge according to FIG. 8 at different pressure levels.
Figure 10:
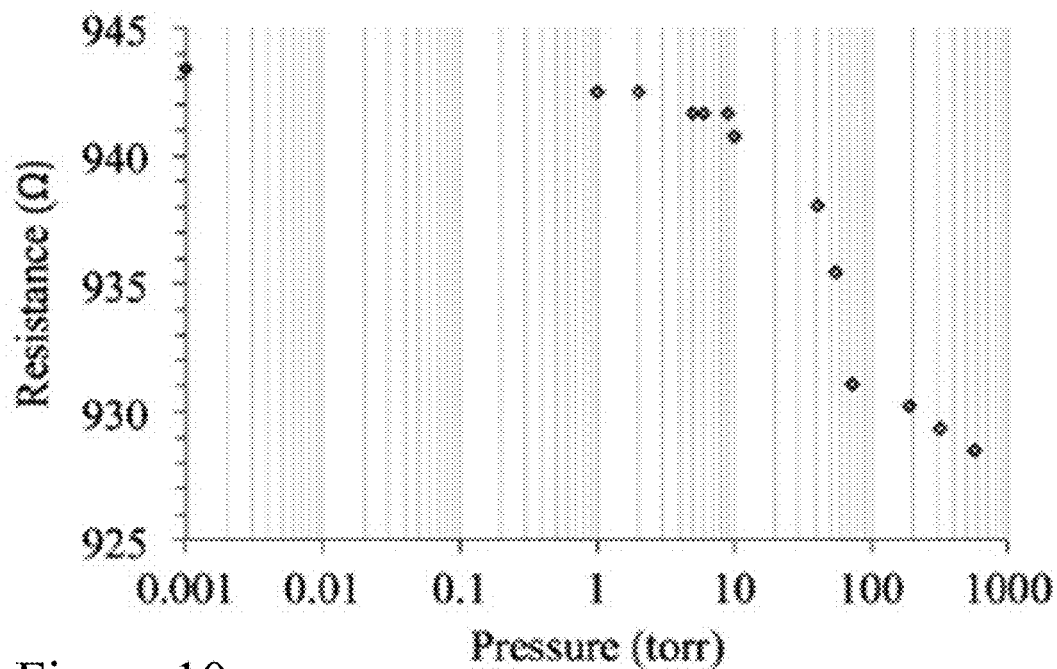
FIG. 10 depicts the response of a sealed Pirani gauge for 101 hours according to the prior art of Zhang using a capping layer formed from SiC primarily with Parylene C sealing of vent holes.
Figure 11A:
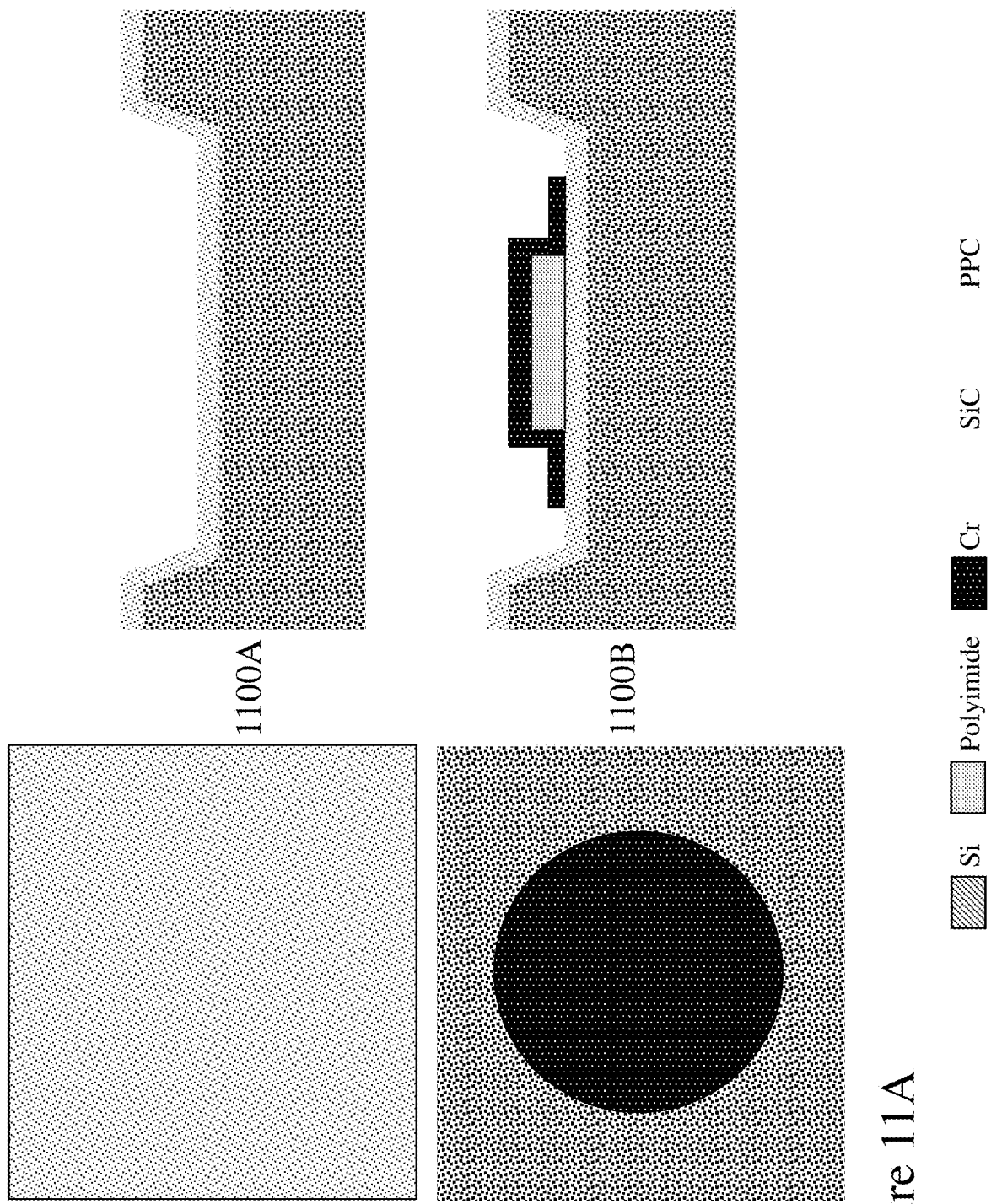
FIGS. 11A to 11D respectively depict an exemplary process flow for a CMOS compatible absolute capacitive pressure sensor according to an embodiment of the invention exploiting a MEMS-CMOS-MEMS processing sequence wherein the CMOS denotes a differentiation between initial high temperature MEMS processing and subsequent low temperature MEMS processing.
Figure 11B:
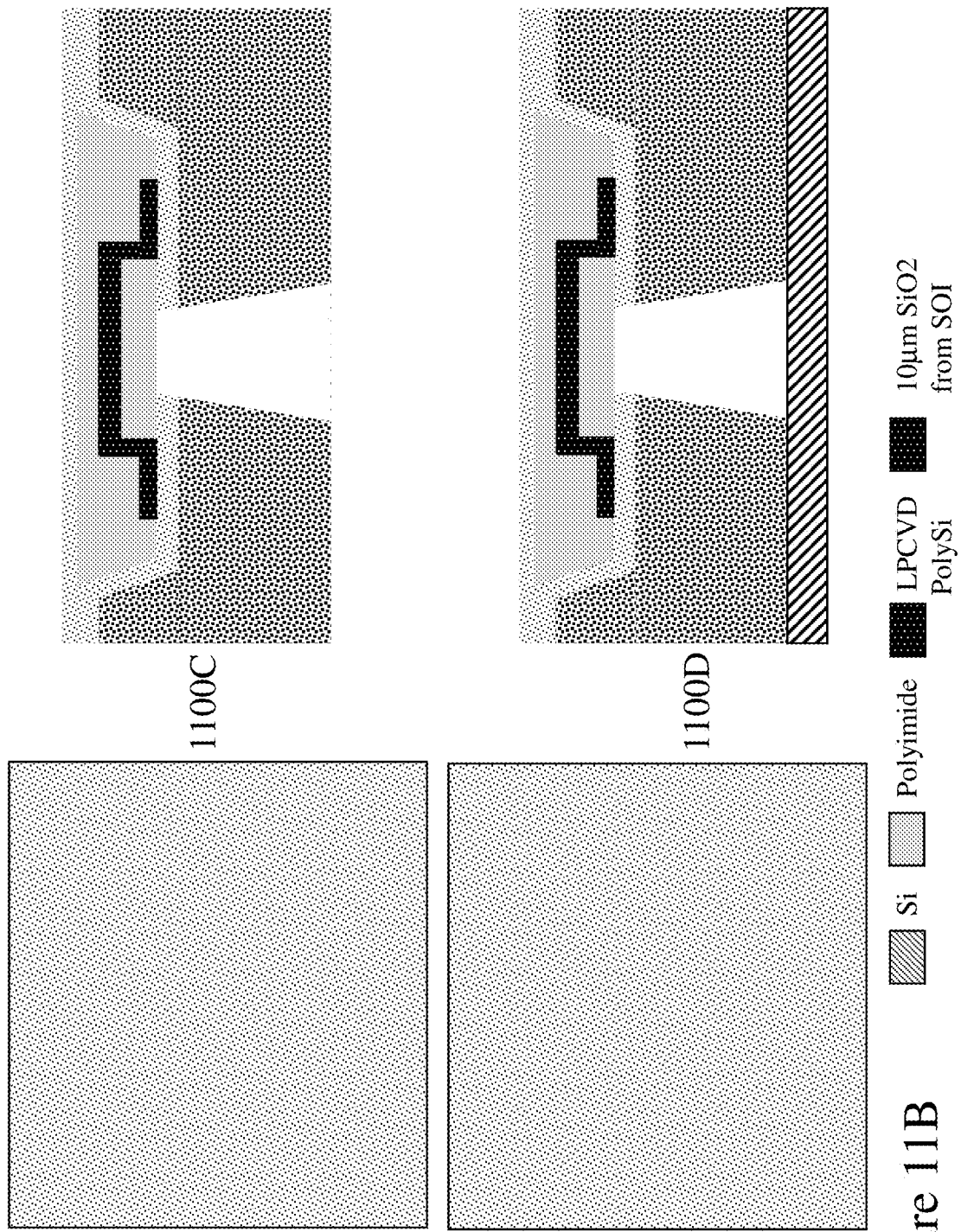
Figure 11C:
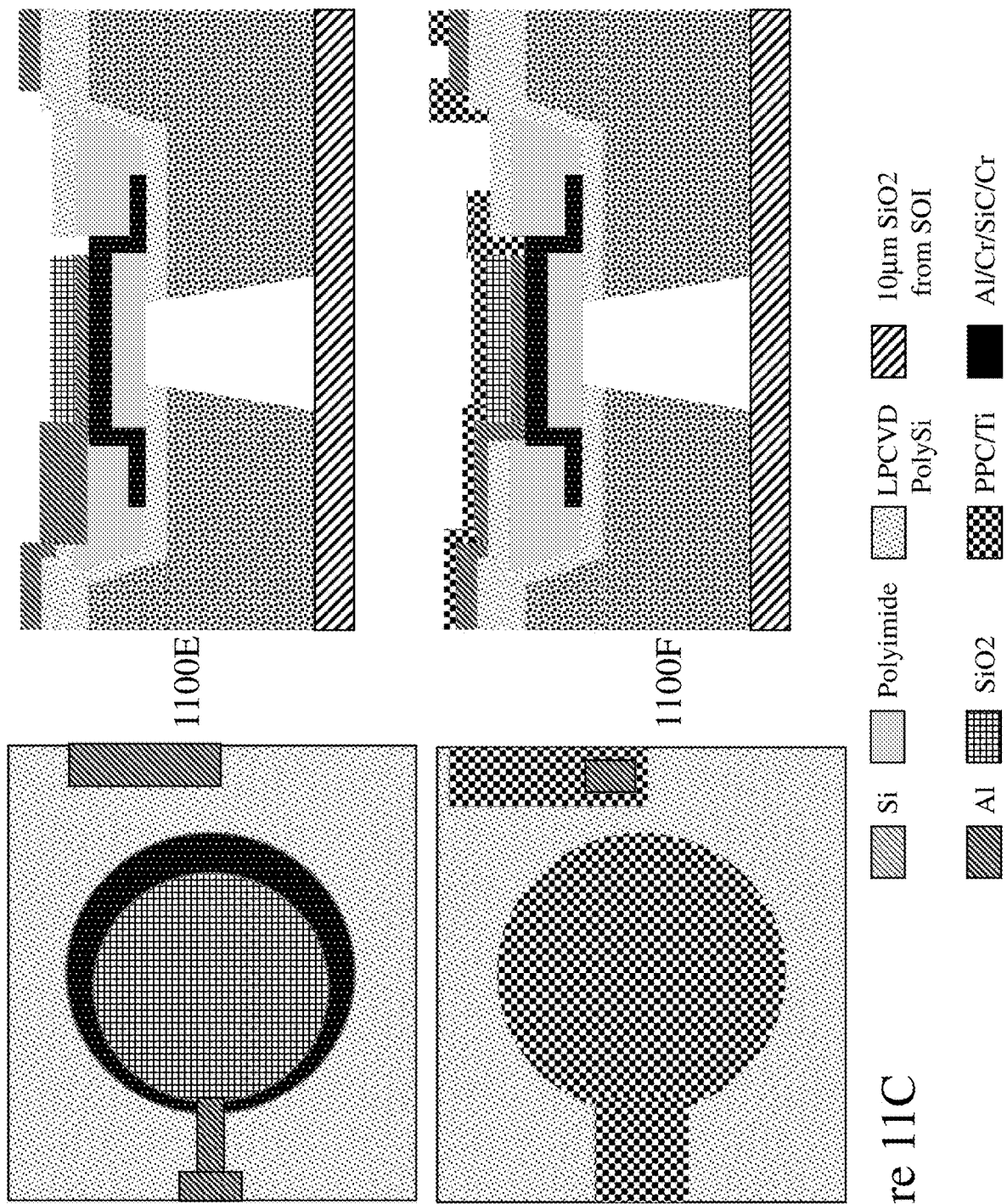
Figure 11D:
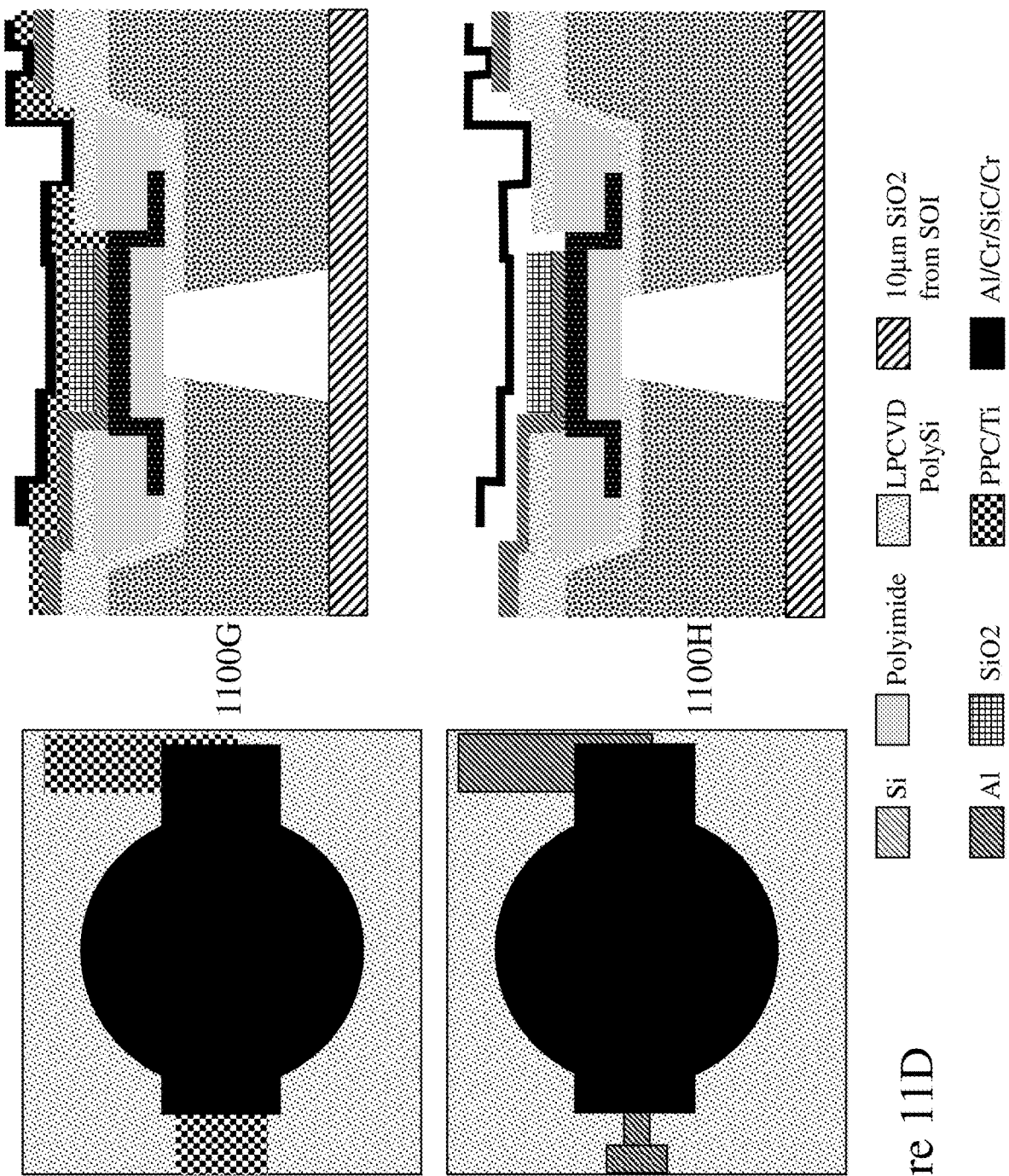

Zhang monitored the response of the encapsulated Pirani gauge at ambient room pressure. For comparison purposes, the behavior of the Pirani gauge was tested with the same settings before the sealing took place. The results of Zhang are depicted in FIG. 9, showing the resistivity for different cavity pressures. After the encapsulation, the device was monitored for the first 101 hours yielding the results presented in FIG. 10. The data demonstrated that the device was sealed for the first 21 hours, but then the air started to leak and build up until the cavity pressure reached the external pressure. Therefore, a new sealing material or approach must be considered to enhance the response, and maintain the sealing much longer.

D: Novel Capacitive Pressure Sensor Technology

The inventors had originally planned to exploit low temperature SiC capping layers on top of the electronic circuit in order to achieve a design with highest compatibility of the pressure sensor design with a CMOS-first integration approach as discussed earlier. Unfortunately, the inventors established that room temperature deposited SiC is an amorphous film, which means that void spaces and nano-channels are formed within the film. Thus, it is impossible for an amorphous diaphragm to maintain vacuum levels in a cavity. Sealing the SiC cap with different layers helped to lower the gas permeability through the diaphragm as shown by Zhang, but absent significant development in film technology the vacuum will only last for hours.

The inventors surmised that diaphragms fabricated at high temperatures will be able to maintain vacuum, because they feature less nano-channels. Therefore, the inventors considered using the MEMS-first integration approach, since high temperature depositions are allowed. One methodology was to incorporate back-etching and bonding steps to create the vacuum reference. However, building the whole MEMS inside a trench is a challenge, due to the high aspect ratios involved, masking, the release time, doping, and stresses. Hence, reducing the number of the MEMS portions that have to be fabricated prior to the CMOS processing inside the trench is beneficial to lower the design complexity.

Accordingly, as the requirement is that it is the diaphragm that needs to be fabricated using a high temperature deposition technique, the inventors conceived that the best approach for fabricating a monolithic absolute capacitive pressure sensor is to divide the MEMS process flow into two parts: the high temperature processes and the low temperature processes. Accordingly, the methodology developed by the inventors is to start with the definition of the polysilicon movable diaphragm inside a trench, which consists the high temperature process. Then, the CMOS is manufactured next to the MEMS area, using standard IC foundry capabilities. Finally, the remaining low temperature MEMS processes, i.e. insulators, electrodes, and interconnections, can all be realized by the surface micro-machined method on top of the movable diaphragm.

Accordingly, the inventor's methodology mixes CMOS and MEMS, which is similar to the interleaving approach introduced earlier. However, in the inventor's process the transitions to/from CMOS or MEMS to the other of CMOS and MEMS are made whenever necessary to achieve the specific sequence of manufacturing steps that mitigate the problems introduced by the high temperature steps. Further, through the low temperature process steps the inventor's approach allows for the use of different materials, which is different from the traditional interleaving approach where the MEMS device shares the same materials as the CMOS circuit.

However, the inventor's process does restrict the choice of materials that can be used for the high temperature process steps. As noted supra the inventors have adopted polysilicon because it can withstand the CMOS harsh conditions. However, despite this material election limitation the inventive process still has several competitive advantages including:

Different deposition and etching methods can be used.
Good quality films can be obtained.
No need for doping in order to build the conductive parts of the MEMS structure.
Al can still be used for the conductive structures and interconnections after the CMOS implementation.

D.1 Inventive CMOS-MEMS Process Flow

Within the following description an insight into the sequence of the process proposed by the inventors and effective etching chemicals that can be used for each step are presented. However, thicknesses are not included as the intention is to depict a generic pressure sensor design rather than a single specific implementation. However, it would be evident to one of skill in the art that through exploiting the same common processing sequence and varying the thickness of each layer that different pressure sensors may be implemented in terms of having different performance with respect to linearity, sensitivity, output full scale, etc.

Referring to FIGS. 11A to 11D there are depicted first to eighth process images 1100A to 1100H for implementing an absolute capacitive pressure sensor according to an embodiment of the invention. Each of these first to eight process images 1100A to 1100H depicts a plan view (left) and cross-sectional view (right). The process begins as depicted in first process image 1100A with the etching of the shallow trench to the required depth on the Si substrate surface by KOH (potassium hydroxide), i.e. 3 µm deep, 5 µm deep etc. to hide the polysilicon and the deposition of a low stress SiN layer via LPCVD to isolate the MEMS electrically. It is beneficial to make the trench wide enough so that the non-uniform surface of the spin coated photoresist near the trench edges will not cause problems. Next, as depicted in the second process image 100B a $SiO_2$ spacer is deposited by low pressure CVD (LPCVD) and patterned by 10:1 hydrofluoric acid (HF) to form the reference cavity. At this point the LPCVD polysilicon is deposited to form the diaphragm that covers the spacer, and a second KOH solution is used to shape the polysilicon.

Next, as depicted in the third process image 1100C, the trench is filled using multiple $SiO_2$ films employed to ensure a conformal coverage, and then CMP polishing is used to flatten the surface for the CMOS preparation. Also, an annealing step is performed, and a protective SiN layer is placed over the trench area. Next, the IC circuits, which are not shown in FIGS. 11A to 11D are implemented outside the trench within the Si substrate.

Upon completion of the CMOS circuit fabrication the low temperature MEMS process sequence starts next, and its first step is the back etching of the silicon substrate using a KOH solution to access the oxide spacer. A wet etchant (i.e. 10:1 HF) to get rid of this oxide, since there is no risk of stiction due to the mechanical feature. The last procedure to capture a vacuum into the cavity is the bonding of an SOI wafer to seal the back opening as depicted in the fourth process image 1000D. Both the oxide and the substrate handle of the SOI wafer are removed.

At this point $CF_3$:$CHF_4$ RIE is performed as well as 10:1 HF etching in order to remove part of the protective $Si_3N_4$ filling and filling $SiO_2$ respectively, and eventually exposing most of the diaphragm to implement the surface micro-machined steps directly on it. It is beneficial at this point to keep some of the filling $SiO_2$ in order to avoid the problems of film discontinuity due to high aspect ratios. Next, Al and $SiO_2$ are deposited successively, and wet patterned by PAN and the same HF solution via two different masks. The Al is employed for the first electrode and contact pad of the top electrode, but the $SiO_2$ is just for covering the first electrode in order to prevent a short circuit between the two capacitor-plates. The device cross-section at this point being depicted in the fifth process image 1100E. Another spacer is spin-coated to suspend the top electrode, but in this instance is formed from PPC due to its ability to sublime at 300° C. yielding the cross-section depicted in the sixth processing image FIG. 1100F. The PPC is also used to protect the previously patterned Al film from the following wet etching processing during the top electrode formation steps, but a small area at the top electrode contact pad is left uncovered in order to provide a connection between the top electrode and its contact pad. Thus, the Ti film used for patterning the PPC, as explained supra, will not be removed because of the poor selectivity of the BOE between the Ti film and the Al top electrode contact pad. In other words, the Ti will be a part of the suspended top electrode, but it is not shown in FIG. 11B for simplicity.

Next the Al, Cr, SiC, and Cr layers are sputter deposited in sequence, because the thin film Al needs a support. The inventors choose SiC to be part of the top electrode due to its mechanical robustness and low deposition temperature. As explained supra, the last Cr is wet patterned by CR-14s (a mixture of ceric ammonium nitrate and acetic acid) to provide an etch mask for the SiC layer. Then, the SiC has been NF3 RIE etched until reaching the Cr stop etch layer. The exposed area of both the Cr films and the Al are wet etched in turn yielding the cross-section depicted in the seventh processing image 1100G. Finally, the wafer is dipped into a BOE solution and heated in order to remove the accessible Ti area and to decompose the PPC layer respectively yielding the device cross-section depicted in the eighth processing image 1100H.

Accordingly, a monolithic absolute capacitive pressure sensor is achieved with monolithic integration to CMOS. The exemplary process sequence presented incorporates a high temperature deposition technique for the membrane without degrading the CMOS circuit performance. The process exploits a combination of a MEMS-first integration approach in conjunction with a surface micro-machining process before progressing to CMOS manufacturing and returning to MEMS processing for its final lower temperature processing stages.

Whilst the embodiments of the invention described and depicted supra refer to pressure sensors it would be evident to one of skill in the art that the MEMS devices fabricated within a trench, well, recess, etc. within the silicon substrate supporting a MEMS-CMOS-MEMS processing methodology that a variety of other sensors and MEMS devices may be formed. For example, sensors such as those relating sound, acoustics, vibration, chemicals, humidity, pressure, fluid flow, position, displacement, force, level, temperature, proximity, and acceleration may be employed. For each type of sensor, different sensing mechanisms may exist including, but not limited to, capacitive sensing which may, for example, be targeted to different dynamic ranges, speed, accuracy, etc. Other MEMS devices may, for example, exploit mechanical elements such as beams, gears, diaphragms, and springs whilst others may include microfluidic devices such as inkjet-printer cartridges or so-called "lab-on-a-chip" biochemical devices, accelerometers, miniature robots, micro-engines, locks, inertial sensors, micro-drives, micro-mirrors, micro actuators, optical scanners, fluid pumps, transducers, etc.

Whilst the embodiments of the invention describe diaphragms formed from polysilicon it would be evident that within other embodiments of the invention that other materials may be employed either within absolute pressure sensors where the diaphragm can meet the lifetime requirements for maintaining the target pressure within the reference cavity or within relative pressure sensors. Examples of alternate materials other than polysilicon and SiC include, but are not limited to, silicon (Si), $SiO_2$, $Si_3N_4$, silicon oxynitride ($SiO_xN_y$), carbon (C), and aluminum oxide ($Al_2O_3$).

Whilst polysilicon has been described as a high temperature deposition process within the first MEMS processing sequence within an overall MEMS-CMOS-MEMS process it would be evident that the second phase MEMS processing sequence may also include the deposition of ceramic structure materials such as silicon (Si), $SiO_2$, $Si_3N_4$, silicon oxynitride ($SiO_xN_y$), carbon (C), aluminum oxide ($Al_2O_3$) and SiC. It would be evident to one of skill in the art that such second phase MEMS processing may limit the upper temperature of these processing steps to a maximum temperature of below, for example 25° C., 50° C., 100° C., 200° C., 250° C., 300° C., and 350° C.

Whilst embodiments of the invention have been described and presented with MEMS and CMOS portions of a final component formed within the same surface of a substrate it would be evident that optionally the methods and techniques described may be employed to form CMOS and MEMS within different surfaces of the substrate with via electrical connections or that CMOS and/or MEMS may be formed upon both surfaces of the substrate. Equally, whilst a single MEMS has been described it would be evident that multiple MEMS devices may be formed within a single trench, multiple trenches disposed around/adjacent to the CMOS, or that multiple trenches may be employed with varying numbers of MEMS elements within each.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments. Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
   manufacturing a first portion of a microelectromechanical systems (MEMS) element for monolithic integration with a complementary oxide semiconductor (CMOS) integrated circuit (IC) using a high temperature MEMS process;
   manufacturing the CMOS integrated circuit;
   manufacturing a second portion of the MEMS element during and subsequent to the CMOS integrated circuit; wherein
   the second portion of the MEMS element is formed with a low temperature MEMS process;
   the MEMS element is a self-contained monolithic differential capacitive pressure sensor measuring an external pressure with a capacitive pressure element relative to a reference pressure defined within a reference sealed monolithic capacitive pressure element;

the reference sealed monolithic capacitive pressure element is the first portion of the MEMS element fabricated with the high temperature MEMS process;

the capacitive pressure element is the second portion of the MEMS element fabricated with the low temperature MEMS process;

the first portion of the MEMS element is electrically connected to the CMOS integrated circuit using electrical connections formed during the low temperature MEMS process;

the first portion of the MEMS element is fabricated with the high temperature MEMS process comprising:
  etching a trench within a first surface of a substrate;
  depositing a first sacrificial material of predetermined geometry over a predetermined region of a bottom of the trench;
  forming a diaphragm for the pressure sensor from a predetermined structural material upon a predetermined portion of the first sacrificial material;
  etching a via from a second surface of the substrate distal to the first surface of the substrate to the bottom of the trench;
  etching the first sacrificial material; and
  sealing the via; and the second portion of the MEMS element is fabricated with the low temperature MEMS process comprising:
  forming a lower electrode comprising a first portion upon a surface of the diaphragm and a second portion interconnecting the first portion to a first electrical contact;
  defining an isolation region using a second sacrificial material deposited upon a portion of the lower electrode;
  forming an upper electrode comprising a first portion upon a surface of the second sacrificial material on the first side of the substrate and a second portion interconnecting the first portion to a second electrical contact; and
  etching the isolation region.

2. The method according to claim 1, wherein
the first surface of the substrate is planarized post-formation of the first portion of the MEMS element such that a CMOS manufacturing process for manufacturing the CMOS integrated circuit utilizes contact photolithography.

3. The method according to claim 1, wherein
the predetermined structural material is selected from a group comprising silicon, silicon dioxide, silicon nitride; silicon oxynitride, carbon, aluminum oxide, and silicon carbide.

4. The method according to claim 1, wherein
the low temperature MEMS processing limits a maximum temperature to which the substrate upon which the first portion of the MEMS element and the CMOS integrated circuit is subjected to 350° C.

5. The method according to claim 1, wherein
the capacitive pressure element and reference sealed monolithic capacitive pressure element are vertically stacked upon the first surface of the substrate; and
the CMOS integrated circuit is formed upon a second surface of the substrate.

6. A method comprising:
manufacturing a first portion of a microelectromechanical systems (MEMS) element for monolithic integration with a complementary oxide semiconductor (CMOS) integrated circuit (IC) using a high temperature MEMS process;

manufacturing the CMOS integrated circuit;

manufacturing a second portion of the MEMS element during and subsequent to the CMOS integrated circuit; wherein the second portion of the MEMS element is formed with a low temperature MEMS process;

the MEMS element is a self-contained monolithic differential capacitive pressure sensor measuring an external pressure with a capacitive pressure element relative to a reference pressure defined within a reference sealed monolithic capacitive pressure element;

the reference sealed monolithic capacitive pressure element is the first portion of the MEMS element fabricated with the high temperature MEMS process;

the capacitive pressure element is the second portion of the MEMS element fabricated with the low temperature MEMS process;

the first portion of the MEMS element is electrically connected to the CMOS integrated circuit using electrical connections formed during the low temperature MEMS process; and the second portion of the MEMS element is fabricated with the low temperature MEMS process comprising:
  forming a lower electrode comprising a first portion upon a surface of the diaphragm on a first surface of a substrate and a second portion interconnecting the first portion to a first electrical contact;
  defining an isolation region using a second sacrificial material deposited upon a portion of the lower electrode;
  forming an upper electrode comprising a first portion upon a surface of the second sacrificial material on the first surface of the substrate and a second portion interconnecting the first portion to a second electrical contact; and
  etching the isolation region.

* * * * *